US009438251B2

(12) United States Patent
Miyano

(10) Patent No.: US 9,438,251 B2
(45) Date of Patent: *Sep. 6, 2016

(54) CLOCK GENERATING CIRCUIT, SEMICONDUCTOR DEVICE INCLUDING THE SAME, AND DATA PROCESSING SYSTEM

(71) Applicant: PS4 LUXCO S.A.R.L., Luxembourg (LU)

(72) Inventor: Kazutaka Miyano, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/679,450

(22) Filed: Apr. 6, 2015

(65) Prior Publication Data
US 2015/0214962 A1 Jul. 30, 2015

Related U.S. Application Data

(63) Continuation of application No. 12/805,652, filed on Aug. 11, 2010, now Pat. No. 9,007,861.

(30) Foreign Application Priority Data

Sep. 9, 2009 (JP) ................................. 2009-208455

(51) Int. Cl.
G11C 7/00 (2006.01)
H03L 7/06 (2006.01)
H03L 7/08 (2006.01)
G11C 7/10 (2006.01)
G11C 7/22 (2006.01)
H03L 7/081 (2006.01)
H03L 7/095 (2006.01)
G11C 11/406 (2006.01)

(52) U.S. Cl.
CPC .......... *H03L 7/0802* (2013.01); *G11C 7/1066* (2013.01); *G11C 7/1093* (2013.01); *G11C 7/22* (2013.01); *G11C 7/222* (2013.01); *G11C 11/406* (2013.01); *H03L 7/081* (2013.01); *H03L 7/0814* (2013.01); *H03L 7/0816* (2013.01); *H03L 7/095* (2013.01)

(58) Field of Classification Search
None
See application file for complete search history.

(56) References Cited

U.S. PATENT DOCUMENTS

2002/0125926 A1* 9/2002 Schnell ................ G11C 7/1066
327/156
2002/0180500 A1* 12/2002 Okuda ................ G11C 7/1051
327/158
2003/0067827 A1* 4/2003 Janzen ................ G11C 7/1066
365/222

* cited by examiner

*Primary Examiner* — James G Norman
(74) *Attorney, Agent, or Firm* — Kunzler Law Group, PC

(57) ABSTRACT

A method for generating an internal clock signal by a clock generating circuit, including generating the internal clock signal based on an external clock signal, adjusting a phase of the internal clock signal by using a phase control value to synchronize with a phase of the external clock signal based on a phase difference between the external clock signal and the internal clock signal, switching operation modes including a first operation mode in which a phase of the internal clock signal is controlled at a predetermined cycle by updating the phase control value and a second operation mode in which a phase of the internal clock signal is fixed by fixing the phase control value, and the switching includes switching from the second operation mode to the first operation mode in response to a trigger signal.

16 Claims, 12 Drawing Sheets

CLOCK GENERATING CIRCUIT, SEMICONDUCTOR DEVICE INCLUDING THE SAME, AND DATA PROCESSING SYSTEM

CROSS-REFERENCE TO RELATED APPLICATIONS

The present application is a Continuation Application of U.S. patent application Ser. No. 12/805,652, filed on Aug. 11, 2010, which is based on Japanese Patent Application No. 2009-208455 filed on Sep. 9, 2009, the entire contents of which are hereby incorporated by reference.

BACKGROUND OF THE INVENTION

1. Field of the Invention

The present invention relates to a clock generating circuit and a semiconductor device including the same, and more particularly relates to a clock generating circuit that generates, similarly to a DLL (Delay Locked Loop) circuit, a phase-adjusted internal clock signal, and a semiconductor device including the same. The present invention also relates to a data processing system including such a semiconductor device.

2. Description of Related Art

In recent years, a synchronous memory that performs operations in synchronization with a clock has been widely used for a main memory of a personal computer or the like. Specifically, in a DDR (Double Data Rate) synchronous memory, because an input data and an output data need to be synchronized correctly with respect to an external clock signal, it becomes necessary to provide a DLL circuit that generates an internal clock signal that is synchronized with the external clock signal (see Japanese Patent Application Laid-open No. 2005-292947).

The DLL circuit includes a counter circuit in which a count value is updated based on phases of each of the internal clock signal and the external clock signal, and a delay line that generates the internal clock signal by delaying the external clock signal based on the count value of the counter circuit. Updating of the count value is continued even after the DLL circuit is locked so as to follow the external clock signal. That is, an updating operation of the count value is continued even after the internal clock signal has attained a predetermined phase (generally, zero phase) with respect to the phase of the external clock signal. Thus, certain power is continuously consumed even after the DLL circuit is locked.

A semiconductor device that stops power supply to a DLL circuit during a refresh operation is described in Japanese Patent Application Laid-open No. 2004-273106. An internal clock signal that is an output of a DLL circuit is not used any way during the refresh operation. Therefore, when the power supply to the DLL circuit is stopped during the refresh operation, power consumption at least during the refresh operation can be reduced.

However, when the power supply to the DLL circuit is stopped, the count value of a counter circuit is disadvantageously reset. Therefore, the DLL circuit cannot be accessed until the DLL circuit is relocked after the power supply to the DLL circuit is restarted, and this leads to a decrease in the performance of the semiconductor device.

Because the operation of the DLL circuit is continued until a refresh command is issued, the power consumption by the DLL circuit cannot be reduced during this period.

Such problems occur not only in DLL circuits but it also commonly occurs in clock generating circuits that generate a phase-controlled internal clock signal.

SUMMARY

In one embodiment, there is provided a clock generating circuit comprising: a clock generating unit that generates a first clock signal based on an external clock signal; a phase-controlling unit that controls the clock generating unit by using a phase control value so as to adjust a phase of the first clock signal to synchronize with a phase of the external clock signal; and a mode switching circuit that switches an operation mode of the phase-controlling unit, wherein the phase-controlling unit has a first operation mode in which a phase of the first clock signal is controlled at a predetermined cycle by updating the phase control value and a second operation mode in which a phase of the first clock signal is fixed by fixing the phase control value, the mode switching circuit changes the phase-controlling unit from the second operation mode to the first operation mode in response to a trigger signal, and changes the phase-controlling unit from the first operation mode to the second operation mode in response to a state where the first clock signal attains a predetermined phase, and when the mode switching circuit changes the phase-controlling unit from the second operation mode to the first operation mode, the phase-controlling unit uses the phase control value that is fixed in the second operation mode as an initial value.

According to the present invention, when a first clock signal that is an output of a clock generating unit attains a predetermined phase, the phase of the first clock signal is fixed, and therefore power consumption during a phase control operation can be reduced. Further, because the phase control operation is restarted in response to a trigger signal, the phase of the internal clock signal is not likely to significantly deviate from a desired phase.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A representative example of a technical concept for solving the problem of the present invention is described below. It is needless to mention that the contents that the present application is to claim for patent are not limited to the following technical concept, but to the description of the appended claims. That is, the technical concept of the present invention is to reduce power consumption by stopping a phase control operation of a clock signal instead of stopping generation of the clock signal when the generated clock signal attains a predetermined phase, and restarting the phase control operation in response to a trigger signal. That is, one of the features of the present invention is to achieve reduction in power consumption by intermittently performing the phase control operation. A DLL circuit performs the phase control operation when power is supplied to a semiconductor device or a reset command of the DLL circuit is input, and it stops the phase control operation when the phase control operation is completed (a state where a phase of an external clock signal matches with a phase of an internal clock signal). Thereafter, the DLL circuit restarts the phase control operation in response to the trigger signal and automatically stops the phase control operation in association with a predetermined result of the phase control operation. That is, shifting is performed from a second operation mode where the phase control operation is inactive to a first operation mode where the phase control operation is active in response to the trigger signal and thereafter shifting is performed automatically to the second operation mode. The trigger signal acts in a different way than the reset command. When shifting from the second operation mode to the first operation mode, the phase control operation is performed while retaining a previous phase control value of the second operation mode. The phase control value is modified (updated) or retained (not updated) in the phase control operation. On the other hand, the reset command causes the DLL circuit itself to be reset (that is, the phase control value is discarded) and causes re-generation of anew phase control value.

Preferred embodiments of the present invention are described below in detail with reference to the accompanying drawings.

Figure 1:
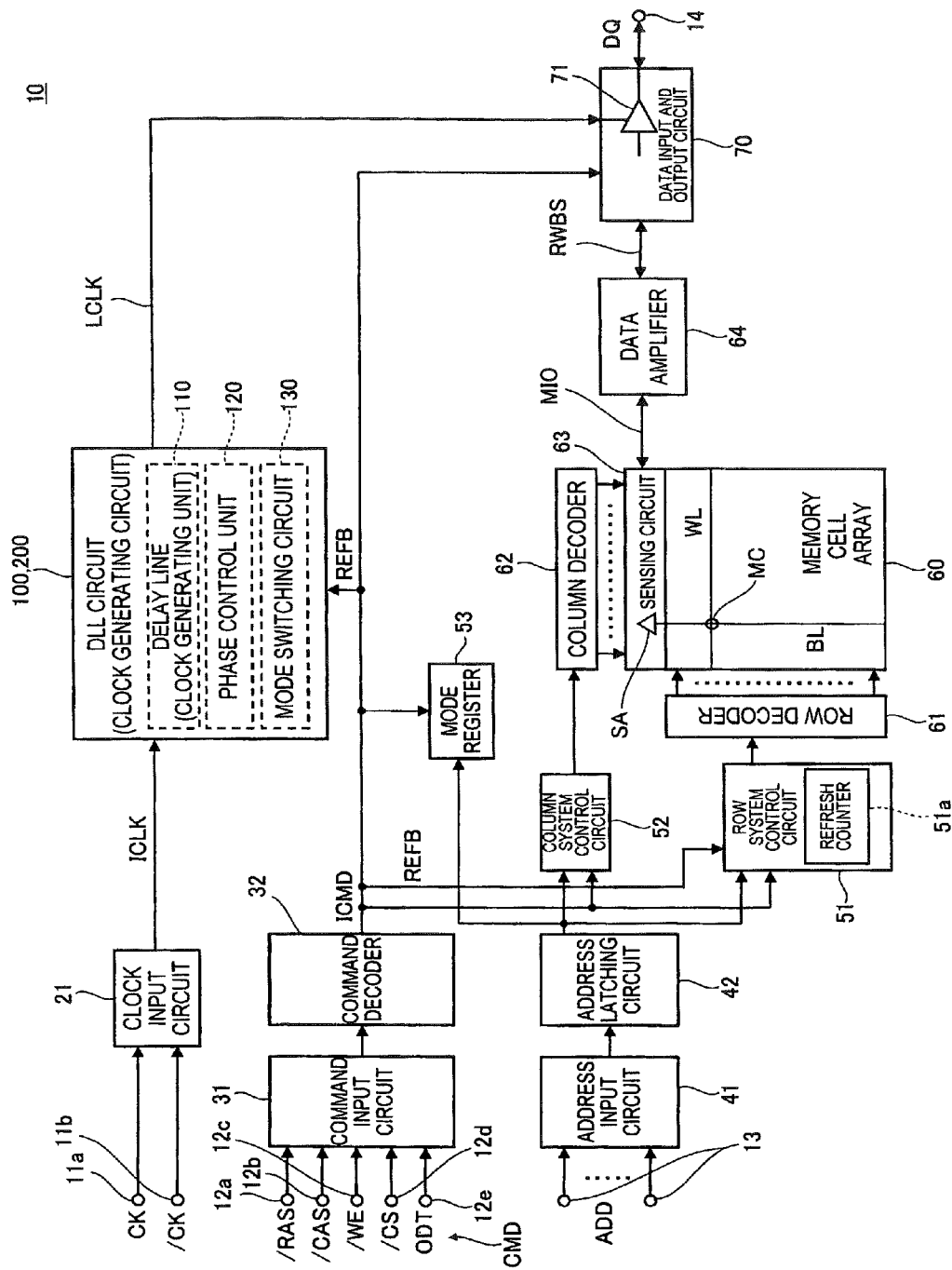
FIG. 1 is a block diagram of an overall configuration of a semiconductor device 10 according to a preferred embodiment of the present invention.

FIG. 1 is a block diagram of an overall configuration of a semiconductor device 10 according to an embodiment of the present invention.

The semiconductor device 10 according to the present embodiment is a DDR SDRAM. The semiconductor device 10 includes, as external terminals, clock terminals 11a and 11b, command terminals 12a to 12e, address terminals 13, and a data input and output terminal 14. While the semiconductor device 10 also includes a power terminal and a data strobe terminal, these terminals are not shown in FIG. 1.

The clock terminals 11a and 11b are terminals to which external clock signals CK and /CK are supplied, respectively. These external clock signals CK and /CK are then supplied to a clock input circuit 21. In the present specification, a signal with a / (slash) at the beginning of the signal name means that the signal is an inverse signal, or a low-active signal, of a corresponding signal. Thus, the external clock signals CK and /CK are complementary to each other. The clock input circuit 21 generates a single-phase internal clock signal ICLK based on the external clock signals CK and /CK, and supplies it to a DLL circuit 100 (200).

The DLL circuit 100 (200) receives the internal clock signal ICLK and generates, with respect to the external clock signals CK and /CK, a phase-controlled internal clock signal LCLK. The DLL circuit 100 (200) supplies the generated internal clock signal LCLK to a data input and output circuit 70. As shown in FIG. 1, the DLL circuit 100 (200) includes a delay line (a clock generating unit) 110, a phase control unit 120, and a mode switching circuit 130. The DLL circuit 100 (200) is described in detail later.

The command terminals 12a to 12e are terminals to which a row address strobe signal /RAS, a column address strobe signal /CAS, a write enable signal /WE, a chip selection signal /CS, and an on-die termination signal ODT are supplied, respectively. These command signals CMD are supplied to a command input circuit 31. From the command input circuit 31, these command signals CMD are supplied to a command decoder 32. The command decoder 32 is a circuit that generates various internal commands ICMD by performing retaining, decoding, counting and the like of the command signals. The generated internal commands ICMD are supplied to each of a row system control circuit 51, a column system control circuit 52, a mode register 53, the data input and output circuit 70, and the DLL circuit 100 (200). As shown in FIG. 1, among the internal commands ICMD, a refresh signal REFB is supplied at least to the row system control circuit 51 and the DLL circuit 100 (200).

The address terminals 13 are terminals to which an address signal ADD is supplied. The address signal ADD is then supplied to an address input circuit 41. An output of the address input circuit 41 is supplied to an address latching circuit 42. Of the address signal ADD that is latched in the address latching circuit 42, a row address part is supplied to the row system control circuit 51 and a column address part is supplied to the column system control circuit 52. Furthermore, when there is an entry in a mode register set, the address signal ADD is supplied to the mode register 53. With this, the contents of the mode register 53 are updated.

The row system control circuit 51 is a circuit that supplies the row address to a row decoder 61. The row address is supplied to the row system control circuit 51 by the address latching circuit 42. The row system control circuit 51 includes a refresh counter 51a. When the refresh signal REFB is activated, a refresh address that is a count value of the refresh counter 51a is supplied to the row decoder 61. The row decoder 61 is a circuit that selects one word line from among the word lines WL of a memory cell array 60. A plurality of the word lines WL and a plurality of bit lines BL are arranged inside the memory cell array 60 in an intersecting manner. Memory cells MC are arranged at the nodes of the word lines WL and the bit lines BL (only one word line WL, bit line BL, and memory cell MC are shown in FIG. 1). A refresh operation (re-updating of memory cell information) is required for maintaining data stored in the memory cells MC. Each bit line BL is connected to a corresponding one of sensing amplifiers SA in a sensing circuit 63.

An output of the column system control circuit 52 is supplied to a column decoder 62. The column decoder 62 is a circuit that selects one sensing amplifier from among the sensing amplifiers SA included in the sensing circuit 63. The sensing amplifier SA selected by the column decoder 62 is connected to a data amplifier 64 via a main I/O line MIO. The data amplifier 64 further amplifies read data that is already amplified by the sensing amplifier SA during a reading operation, and supplies the amplified read data to the data input and output circuit 70 via a read/write bus RWBS. On the other hand, the data amplifier 64 amplifies write data supplied from the data input and output circuit 70 via the read/write bus RWBS during a writing operation, and supplies the amplified write data to the sensing amplifier SA.

The data input and output terminal 14 is a terminal that outputs the read data DQ and inputs the write data DQ, and it is connected to the data input and output circuit 70. The data input and output circuit 70 includes an output buffer 71. The read data DQ is output from the output buffer 71 in synchronization with the internal clock signal LCLK during the read operation. In FIG. 1, only one data input and output terminal 14 is shown. However, it is not necessary that the data input and output terminal 14 be only one. A plurality of data input and output terminals can be provided.

The overall configuration of the semiconductor device 10 is as described above. The DLL circuit 100 is explained next in detail.

Figure 2:
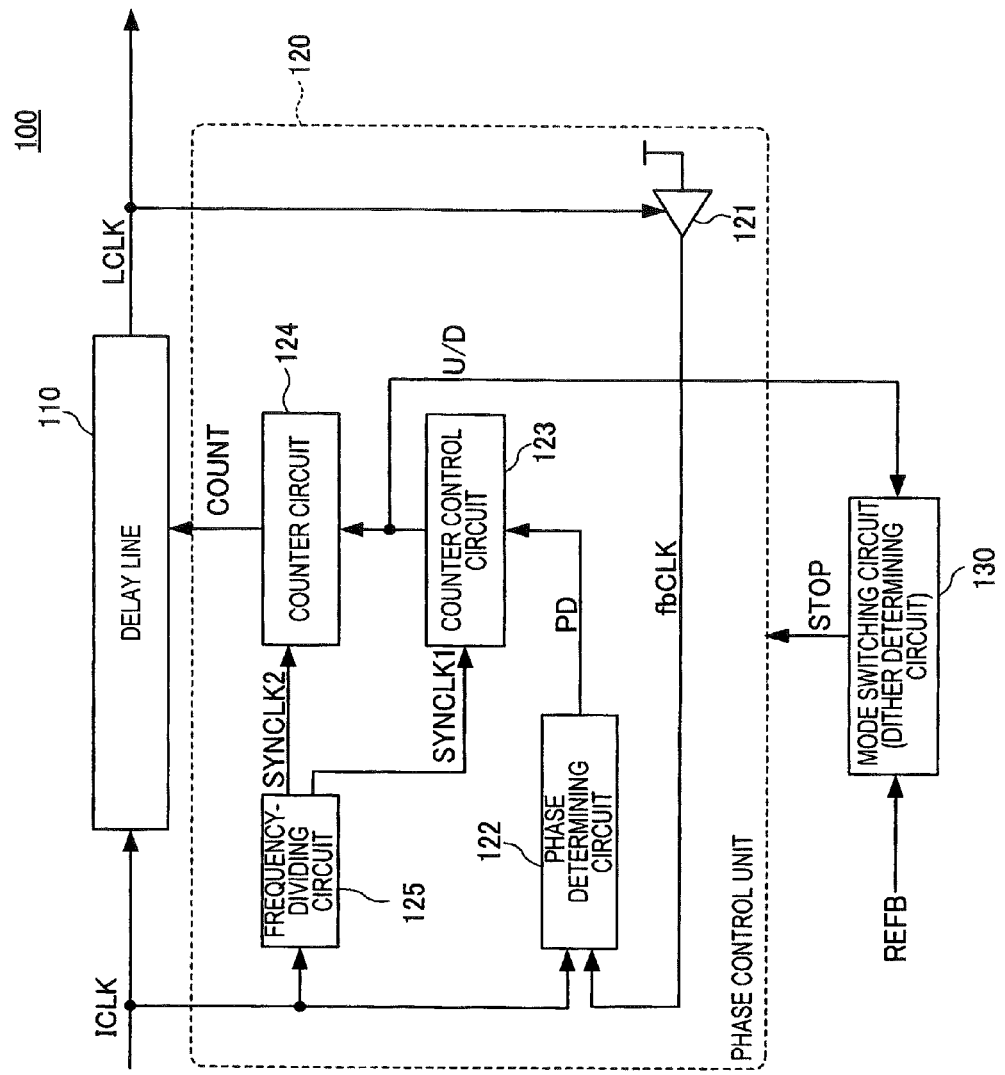
FIG. 2 is a block diagram of the DLL circuit 100 according to a first embodiment of the present invention.

FIG. 2 is a block diagram of the DLL circuit 100 according to a first embodiment of the present invention.

As shown in FIG. 2, the DLL circuit 100 includes the delay line (the clock generating unit) 110, the phase control unit 120, and the mode switching circuit 130.

The delay line 110 is a circuit that generates an internal clock signal LCLK for output by delaying the internal clock signal ICLK. The phase control unit 120 adjusts an amount of delay of the delay line 110. Although the configuration thereof is not particularly limited, the delay line 110 preferably includes a coarse delay line that delays the internal clock signal ICLK at a relatively coarse adjustment pitch, and a fine delay line that delays the internal clock signal ICLK at a relatively fine adjustment pitch.

The phase control unit 120 is a circuit block that receives the internal clock signal ICLK and the internal clock signal LCLK for output. By adjusting the amount of delay of the delay line 110 based on these received signals, the phase control unit 120 adjusts a phase of the internal clock signal LCLK. As shown in FIG. 2, the phase control unit 120 includes a replica circuit 121, a phase determining circuit 122, a counter control circuit 123, a counter circuit 124, and a frequency-dividing circuit 125.

The replica circuit 121 has a configuration that is substantially the same as that of the output buffer 71 shown in FIG. 1. The replica circuit 121 outputs a feedback clock signal fbCLK in synchronization with the internal clock signal LCLK. Thus, a phase of the feedback clock signal fbCLK exactly matches with a phase of the output signal (read data) DQ. However, the size of a transistor that forms the replica circuit 121 does not need to be the same as the size of a transistor that forms the output buffer 71. As long their impedances are substantially the same, a shrunk transistor can also be used.

The feedback clock signal fbCLK and the internal clock signal ICLK are supplied to the phase determining circuit 122. The phase determining circuit 122 is a circuit that detects a difference between a phase of the internal clock signal ICLK and a phase of the feedback clock signal fbCLK. As described above, the delay line 110 adjusts the phase of the feedback clock signal fbCLK so that the phase coincides with a phase of the read data DQ. However, both the phases change from moment to moment due to a variation of parameters such as a voltage and a temperature affecting the delay amount of the delay line 110, and based on a variation of frequencies of the external clock signals CK and /CK itself. The phase determining circuit 122 detects the change in the phases, and determines whether the phase of the feedback clock signal fbCLK is advanced or delayed with respect to the internal clock signal ICLK. The phase determining circuit 122 performs the determination at each cycle of the internal clock signal ICLK, and supplies a determination result to the counter control circuit 123 as a phase determination signal PD.

The counter control circuit 123 is a circuit that generates an up and down signal U/D (hereinafter, "up/down signal U/D") based on the phase determination signal PD, and updates the up/down signal U/D in synchronization with a sampling clock signal SYNCLK1. The frequency-dividing circuit 125 generates the sampling clock signal SYNCLK1. The frequency-dividing circuit 125 is a circuit that frequency-divides the internal clock signal ICLK and generates the sampling clock signals SYNCLK1 and SYNCLK2 having lower frequencies. Although it is not particularly limited, the number of divisions can be set to 16 or 32. For example, when the frequency-dividing circuit 125 divides the internal clock signal ICLK into 16 divisions, it means that the sampling clock signals SYNCLK1 and SYNCLK2 are activated after every 16 cycles of the internal clock signal ICLK. In this case, a sampling cycle becomes a 16-clock cycle.

The up/down signal U/D generated by the counter control circuit 123 is supplied to the counter circuit 124. The counter circuit 124 is a circuit that performs upcounting or downcounting based on the up/down signal U/D. The counter circuit 124 upcounts or downcounts in synchronization with the sampling clock signal SYNCLK2 whose phase is delayed with respect to the sampling clock signal SYNCLK1. A count value COUNT of the counter circuit 124 is supplied to the delay line 110. The delay amount of the delay line 110 is determined based on the count value COUNT.

The phase control unit 120 that has a configuration mentioned above has the first operation mode that changes the delay amount of the delay line 110 in synchronization with the sampling clock signal SYNCLK2 and the second operation mode that fixes the delay amount of the delay line 110. That is, the phase control operation of the internal clock signal LCLK is performed in the first operation mode and the phase of the internal clock signal LCLK is fixed in the second operation mode.

When the phase control unit 120 shifts to the second operation mode, the operations of the replica circuit 121, the phase determining circuit 122, the counter control circuit 123, the counter circuit 124, and the frequency-dividing circuit 125 are stopped. Thus, only an insignificant amount of power is consumed by the phase control unit 120 in the second operation mode. However, the count value of the counter circuit 124 is not reset even if the phase control unit 120 is shifted to the second operation mode. The count value that is available at the time of shifting to the second operation mode is retained. That is, a delay amount immediately before shifting to the second operation mode is fixed as the delay amount of the delay line 110. Thus, the power supply at least to the counter circuit 124 cannot be cut off. With respect to the replica circuit 121, the phase determining circuit 122, the counter control circuit 123, and the frequency-dividing circuit 125, the power supply can be cut off when the phase control unit 120 is shifted to the second operation mode. However, to shift (return) the phase control unit 120 to the first operation mode rapidly, instead of cutting off the power supply, it is preferable to prepare a state in which the switching is not performed when there is a change in the input signals, that is, the input signals are logically fixed.

An operation mode of the phase control unit 120 is selected according to a stop signal STOP that is supplied from the mode switching circuit 130. Specifically, when a state of the stop signal STOP is inactive (a low level), the operation mode of the phase control unit 120 is set to the first operation mode, and when the state of the stop signal STOP is active (a high level), the operation mode is set to the second operation mode.

As shown in FIG. 2, the up/down signal U/D that is an output of the counter control circuit 123, and the refresh signal REFB that is an output of the command decoder 32 are supplied to the mode switching circuit 130. Based on these signals, the mode switching circuit 130 generates the stop signal STOP. As explained in detail below, in the first embodiment, the mode switching circuit 130 is formed of a dither determining circuit. The dither determining circuit is a circuit that detects a DLL lock by monitoring a change-pattern of the up/down signal U/D. The DLL lock is a state indicating that the phase of the internal clock signal ICLK substantially matches with the phase of the feedback clock signal fbCLK.

Figure 3:
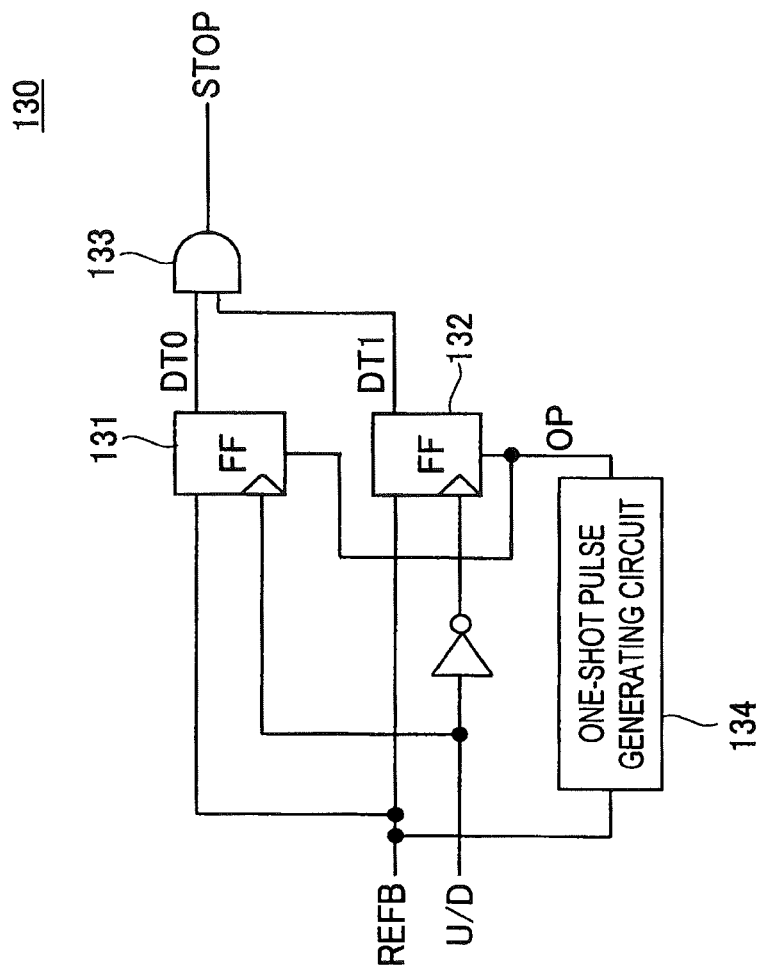
FIG. 3 is a circuit diagram of the mode switching circuit (the dither determining circuit) 130.
Figure 4:
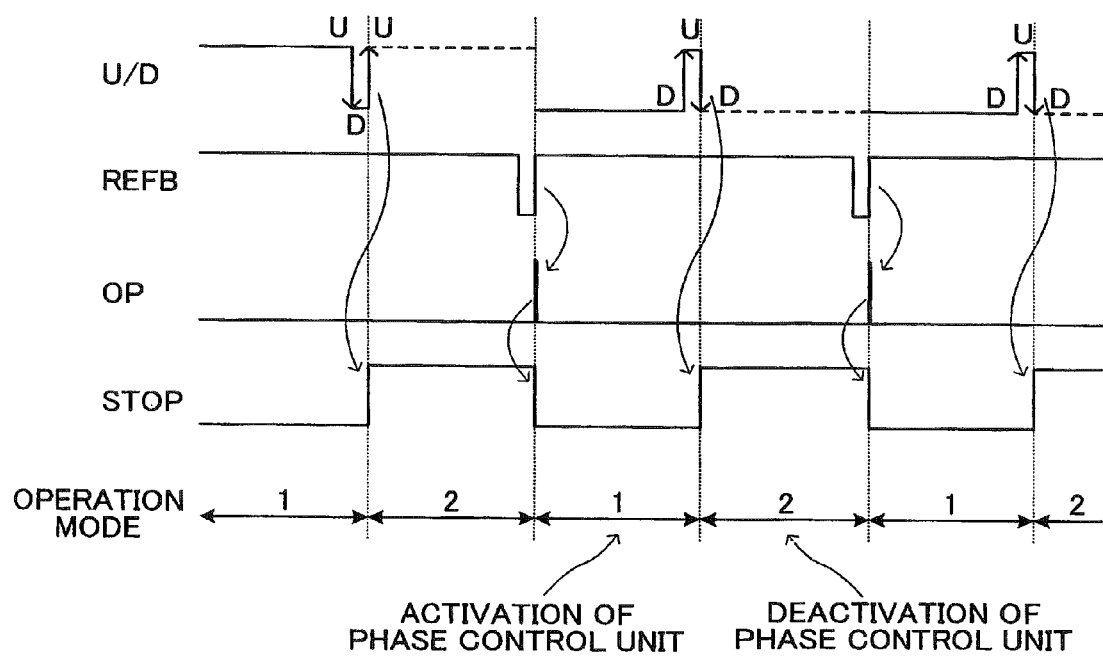
FIG. 4 is a timing chart for explaining operations of the mode switching circuit 130.

FIG. 3 is a circuit diagram of the mode switching circuit (the dither determining circuit) 130 and FIG. 4 is a timing chart for explaining operations of the mode switching circuit (the dither determining circuit) 130.

As shown in FIG. 3, the mode switching circuit 130 according to the first embodiment includes latch circuits 131 and 132 that latch the refresh signal REFB, an AND gate 133 that receives outputs DT0 and DT1 of the latch circuits 131 and 132, and a one-shot pulse generating circuit 134 that generates a one-shot pulse OP based on the refresh signal REFB.

The refresh signal REFB, which is a low-active signal, is normally (when the semiconductor device is at a state in which a command is not issued from outside to refresh cell information) locked to a high level. When the refresh command is issued from outside, the command decoder 32 changes the refresh signal REFB to a low level for a predetermined time. When the row system control circuit 51 completes the refresh operation, the refresh signal REFB returns to a high level. An auto refresh command is an example of the refresh command issued from outside to the semiconductor device. After the refresh operation is completed by the row system control circuit 51, the phase control operation of the DLL circuit 100 is performed by the one-shot pulse generating circuit 134. The one-shot pulse generating circuit 134 is described later. An operation noise in a chip (a semiconductor device) due to the row system control circuit 51 does not affect the accuracy of the phase control operation.

When the refresh signal REFB becomes inactive, that is, when the refresh signal REFB is changed from a low level to a high level, the one-shot pulse generating circuit 134 generates the one-shot pulse OP as shown in FIG. 4. Once the one-shot pulse OP is generated, the latch circuits 131 and 132 are reset and their outputs DT0 and DT1 change to low levels. Thus, the stop signal STOP, which is an output of the AND gate 133, will always be at a low level immediately after the refresh operation is completed. As described above, when the stop signal STOP is at a low level, the first operation mode is selected for the phase control unit 120. That is, the phase control operation of the internal clock signal LCLK, which is synchronized with the sampling clock signal SYNCLK2, is performed.

The up/down signal U/D is supplied to a clock input terminal of the latch circuit 131 and an inverted up/down signal U/D is supplied to a clock input terminal of the latch circuit 132. Thus, when the up/down signal U/D is changed once, a high level is latched in any one of the latch circuits 131 and 132, and when the up/down signal U/D changes once again, a high level is latched in a different one of the latch circuits 131 and 132. That is, when the up/down signal U/D changes two times (that is, when detecting the DLL lock indicating the state that the phase has substantially reached zero by a phase adjustment operation in the dither determination), the outputs DT0 and DT1 of both the latch circuits 131 and 132 change to a high level. As a result, the stop signal STOP that is the output of the AND gate 133 changes to a high level. When the stop signal STOP changes to a high level, the second operation mode is selected for the phase control unit 120. That is, the phase of the internal clock signal LCLK is fixed. A process mentioned above is a dither process of the dither determining circuit. The up/down signal U/D can also be taken as a dither signal.

The up/down signal U/D can change two times in the following two patterns. One, the up/down signal U/D changes in the order of up determination, down determination, and up determination (U/D/U). Second, the up/down signal U/D changes in the order of down determination, up determination, and down determination (D/U/D). Any one of these patterns can appear when the phase of the external clock signal CK substantially matches with the phase of the feedback clock signal fbCLK, that is, when the DLL circuit is locked.

Thus, as shown in FIG. 4, the phase control unit 120 is shifted from the first operation mode to the second operation mode each time the DLL lock is detected in the dither determination. Furthermore, the phase control unit 120 is shifted from the second operation mode to the first operation mode each time the refresh signal REFB is activated. That is, the power consumption of the phase control unit 120 is reduced because of intermittently performing the phase control operation according to the trigger signal (the refresh signal REFB).

When the phase control unit 120 is shifted to the second operation mode, the phase control operation is stopped. Therefore, there is a possibility that the internal clock signal LCLK does not correctly follow the external clock signals CK and /CK. However, according to the first embodiment, the refresh signal REFB that activates at predetermined intervals is used as the trigger signal to return the phase control unit 120 to the first operation mode. Therefore, shifting of the phase due to stoppage of the phase control operation almost does not take place. Specifically, because the issue frequency of the auto refresh command is of the order of microseconds, noticeable shifting of the phase exceptionally occurs within such a short period. As a result, the output quality of the read data is not deteriorated by intermittently stopping the phase control operation. On the other hand, during the period in which the phase control operation is stopped, a jitter is not generated in the internal clock signal LCLK. Therefore, there is a possibility of improvement in the output quality of the read data.

According to the first embodiment, by focusing on a point that the auto refresh command is activated at the predetermined intervals, the auto refresh command is used as the trigger signal for shifting the phase control unit 120 from the second operation mode to the first operation mode. Therefore, any dedicated circuit for shifting the phase control unit 120 to the first operation mode does not need to be added.

A second embodiment of the present invention is explained next.

Figure 5:
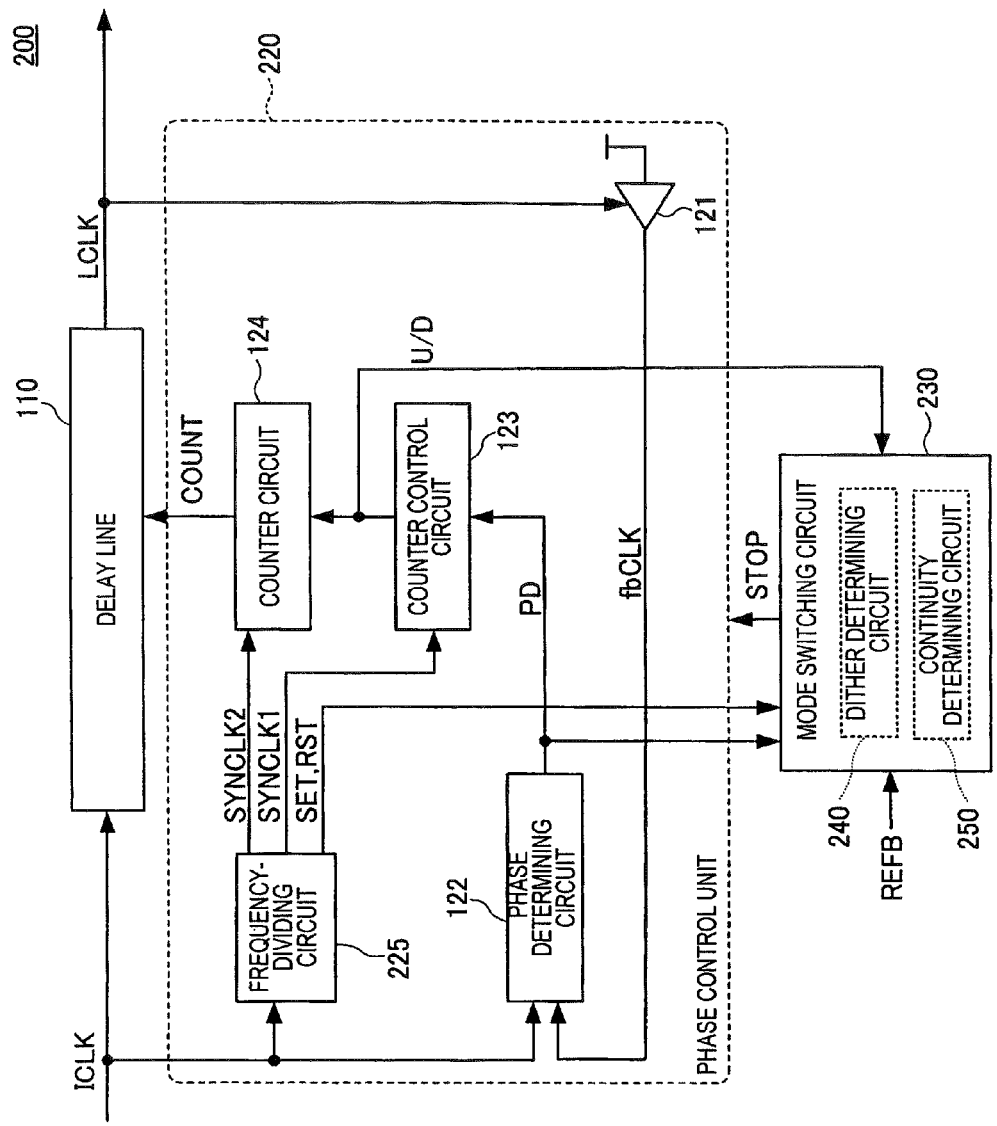
FIG. 5 is a block diagram of the DLL circuit 200 according to the second embodiment.

FIG. 5 is a block diagram of the DLL circuit 200 according to the second embodiment.

The DLL circuit 200 according to the second embodiment differs from the DLL circuit 100 according to the first embodiment in the following aspects. That is, in the second embodiment, the phase control unit 120 and the mode switching circuit 130, respectively, are replaced by a phase control unit 220 and a mode switching circuit 230. Furthermore, the phase control unit 220 differs from the phase control unit 120 shown in FIG. 2, in that it includes a frequency-dividing circuit 225 instead of the frequency-dividing circuit 125. The DLL circuit 200 is identical to the DLL circuit 100 in all other respects. Therefore, like reference numerals are denoted to like elements and redundant explanations thereof will be omitted.

In addition to the sampling clock signals SYNCLK1 and SYNCLK2, the frequency-dividing circuit 225 generates a set signal SET and a reset signal RST. The set signal SET has the same cycle as that of the sampling clock signals SYNCLK1 and SYNCLK2. Therefore, one of the sampling clock signals SYNCLK1 and SYNCLK2 can be used as the set signal SET. The reset signal RST has a longer cycle than the sampling clock signals SYNCLK1 and SYNCLK2. It is preferable to set the cycle of the reset signal RST about four times the cycle of the sampling clock signals SYNCLK1 and SYNCLK2. When the cycle of the sampling clock signals SYNCLK1 and SYNCLK2 is 16 times the cycle of the internal clock signal ICLK, the cycle of the reset signal RST becomes 64 times the cycle of the internal clock signal ICLK.

The set signal SET and the reset signal RST are supplied to the mode switching circuit 230. As shown in FIG. 5, the mode switching circuit 230 includes a dither determining circuit 240 and a continuity determining circuit 250.

Figure 6:
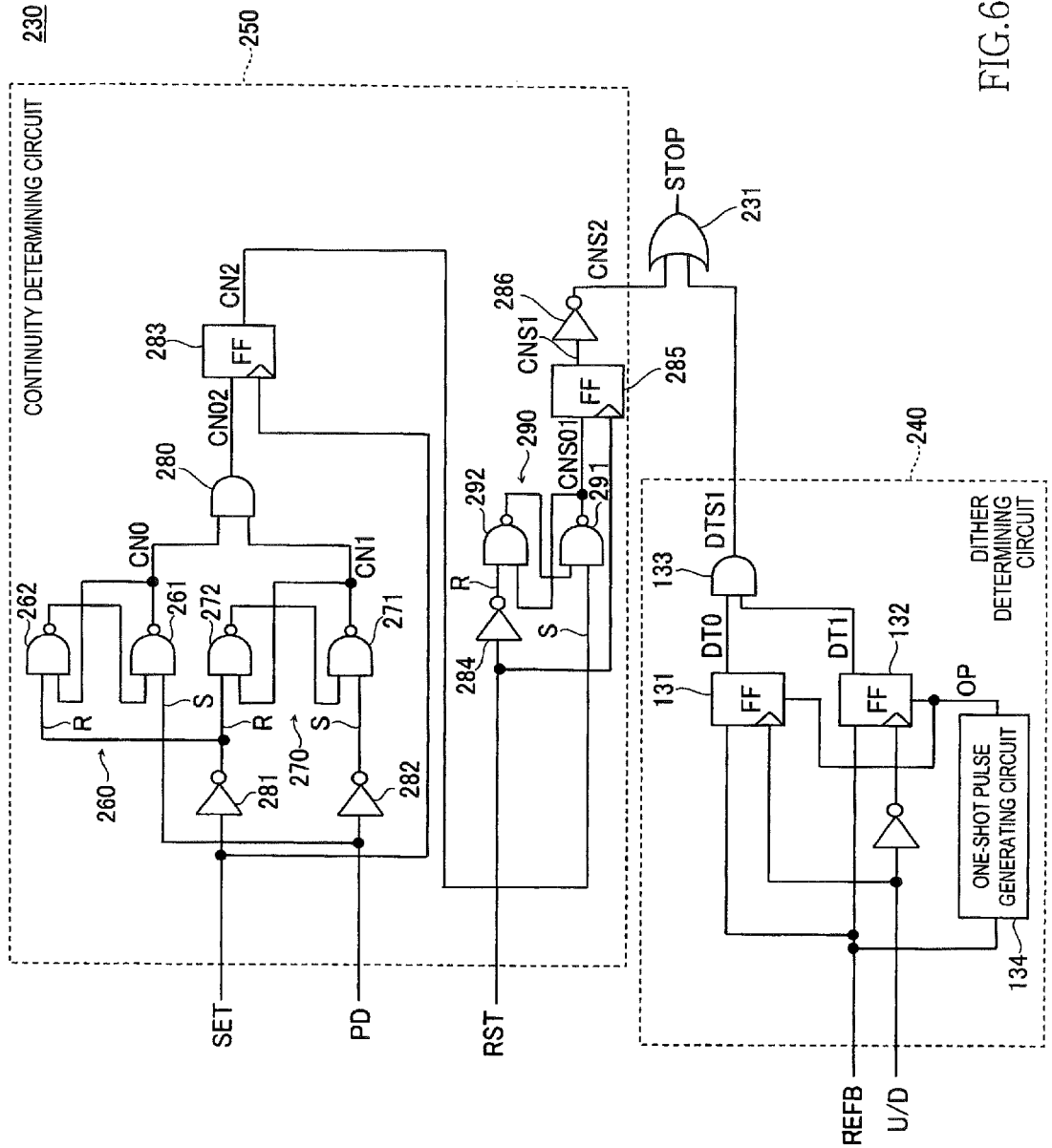
FIG. 6 is a circuit diagram of the mode switching circuit 230.
Figure 7:
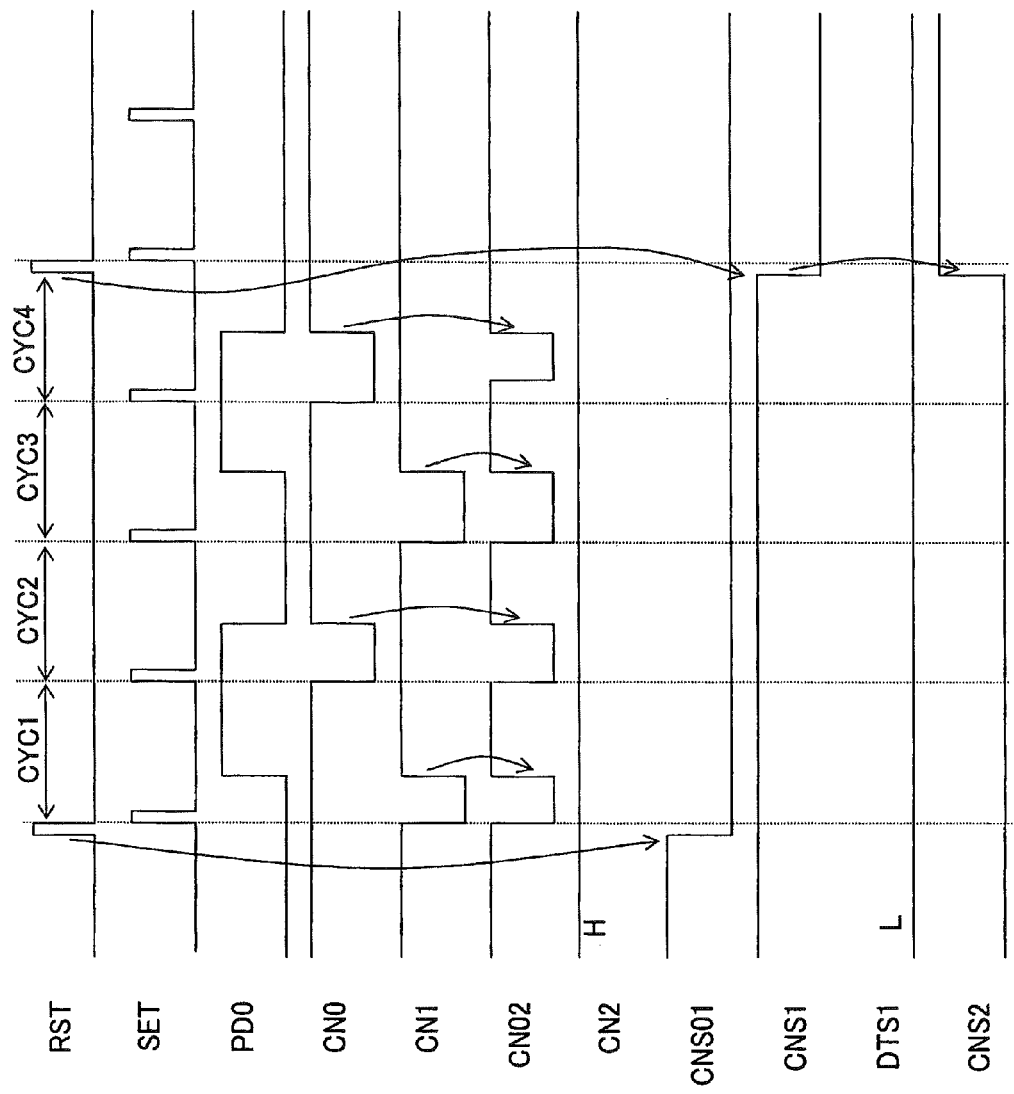
FIG. 7 is a timing chart for explaining operations of the mode switching circuit 230.

FIG. 6 is a circuit diagram of the mode switching circuit 230 and FIG. 7 is a timing chart for explaining operations of the mode switching circuit 230.

As shown in FIG. 6, the continuity determining circuit 250 includes SR latch circuits 260 and 270, and an AND gate 280. The AND gate 280 receives determination signals CN0 and CN1 that are outputs of the SR latch circuits 260 and 270.

The SR latch circuit 260 has a configuration in which NAND gates 261 and 262 are connected in a cyclic manner. A set input terminal (S) is arranged on the NAND gate 261 side and a reset input terminal (R) is arranged on the NAND gate 262 side. The phase determination signal PD is supplied to the set input terminal (S) and the set signal SET that is inverted by an inverter 281 is supplied to the reset input terminal (R).

Similarly, the SR latch circuit 270 has a configuration in which NAND gates 271 and 272 are connected in a cyclic manner. A set input terminal (S) is arranged on the NAND gate 271 side and a reset input terminal (R) is arranged on the NAND gate 272 side. The phase determination signal PD that is inverted by an inverter 282 is supplied to the set input terminal (S) and the set signal SET that is inverted by the inverter 281 is supplied to the reset input terminal (R).

With such a configuration, when the set signal SET is activated, one of the determination signals CN0 and CN1 changes to a high level, and the other one of these signals changes to a low level. Which one of the determination signals CN0 and CN1 changes to a high level depends on the logic level of the phase determination signal PD at the time point at which the set signal SET is activated. Due to this, a determination signal CN02 changes to a low level by necessity after the set signal SET is activated. The determination signal CN02 remains at a low level when the logic level of the phase determination signal PD does not change. However, when the logic level of the phase determination signal PD is changed before the set signal SET is activated next time, the determination signal CN02 changes to a high level. The determination signal CN02 is supplied to a latch circuit 283 and it is output as a determination signal CN2 in synchronization with the set signal SET. That is, the continuity determining circuit 250 determines whether the logic level of the phase determination signal PD changes during the activation cycle of the set signal SET. In the timing chart shown in FIG. 7, the phase determination signal PD changes in the entire continuous update cycles CYC1 to CYC4 that are regulated by the set signal SET. Therefore, the determination signal CN2 is retained at a high level.

As shown in FIG. 6, the continuity determining circuit 250 further includes an SR latch circuit 290. The SR latch circuit 290 has a configuration in which NAND gates 291 and 292 are connected in a cyclic manner. A set input terminal (S) is arranged on the NAND gate 291 side and a reset input terminal (R) is arranged on the NAND gate 292 side. The determination signal CN2 is supplied to the set input terminal (S) and the reset signal RST that is inverted by an inverter 284 is supplied to the reset input terminal (R). A determination signal CNS01 that is an output of the SR latch circuit 290 is supplied to a latch circuit 285 and it is then output as a determination signal CNS1 in synchronization with the reset signal RST. The determination signal CNS1 is inverted by an inverter 286 and it is then output as a high-active determination signal CNS2.

With such a configuration, when the reset signal RST is activated, the determination signal CNS01 that is the output of the SR latch circuit 290 changes to a low level. However, when the determining circuit CN2 changes to a low level at least once before the reset signal RST is activated next time, the determination signal CNS01 changes to a high level. As described above, when the determination signal CN2 changes to a low level, it represents a state where the logic level of the phase determination signal PD has not changed during the update cycle. On the other hand, according to an example shown in FIG. 7, when the determination signal CN2 is always maintained at a high level until the reset signal RST is activated next time, the determination signal CNS01 is maintained at a low level because the SR latch circuit 290 is not set. As described above, when the determination signal CN2 changes to a high level, it represents a state where the logic level of the phase determination signal PD has changed during the update cycle.

The determination signal CNS01 that is the output of the SR latch circuit 290 is latched in the latch circuit 285 in synchronization with the reset signal RST and it is then output as the determination signal CNS2 via the inverter 286. Thus, when a phenomenon in which the logic level of the phase determination signal PD does not change in the update cycle that is one cycle of the set signal SET appears at least once in one cycle of the reset signal RST, the determination signal CNS2 changes to a low level (an inactive level). On the other hand, when a phenomenon in which the logic level of the phase determination signal PD changes during the update cycle appears in all of the update cycles included in one cycle of the reset signal RST, the determination signal CNS2 changes to a high level (an active level).

The determination signal CNS2 that is obtained as mentioned above is supplied to one input terminal of an OR gate 231. A determination signal DTS1 that is an output of the dither determining circuit 240 is supplied to the other input terminal of the OR gate 231.

The dither determining circuit 240 has a circuit configuration that is the same as that of the mode switching circuit 130 shown in FIG. 3. Thus, when the DLL lock is detected in the dither determination, the determination signal DTS1 that is the output of the dither determining circuit 240 is activated to a high level. The operations of the dither determining circuit 240 are explained above in connection with the mode switching circuit 130.

In the second embodiment of the present invention, the output of the OR gate 231 is used as the stop signal STOP. Thus, when at least one of the outputs of the dither determining circuit 240 (DTS1) and the continuity determining circuit 250 (CNS2) is activated, the stop signal STOP changes to a high level.

Thus, in the second embodiment, the phase control unit 220 is shifted to the second operation mode not only when the DLL lock is detected by the dither determination as in the first embodiment, but also when a phenomenon in which the phase determination signal PD changes in one cycle of the set signal SET occurs continuously for multiple times. That is, when the trigger signal (the refresh signal REFB) is activated, the phase control operation shifts from the second operation mode to the first operation mode and the phase detection process is begun. During this process, the phases of the internal clock signal ICLK and the feedback clock signal fbCLK are possible to be almost the same. In the second embodiment, a DLL lock is also detected in such a case because a non-continuity determination that shows a stable status in which the up/down signal U/D is not changed is made. The phase control unit 220 according to second embodiment is shifted to the second operation mode in response to the DLL lock detected even in this manner. As described above, a pattern in which the phase determination signal PD changes in the middle of all the successive update cycles is one of the patterns that appears when the DLL is locked. This pattern sometimes appears before the pattern that is detected in the dither determination. Thus, when the dither determination is combined with the non-continuity determination according to the second embodiment, the DLL circuit lock can be detected promptly. As a result, power consumption can be further reduced.

A third embodiment of the present invention is explained next.

Figure 8:
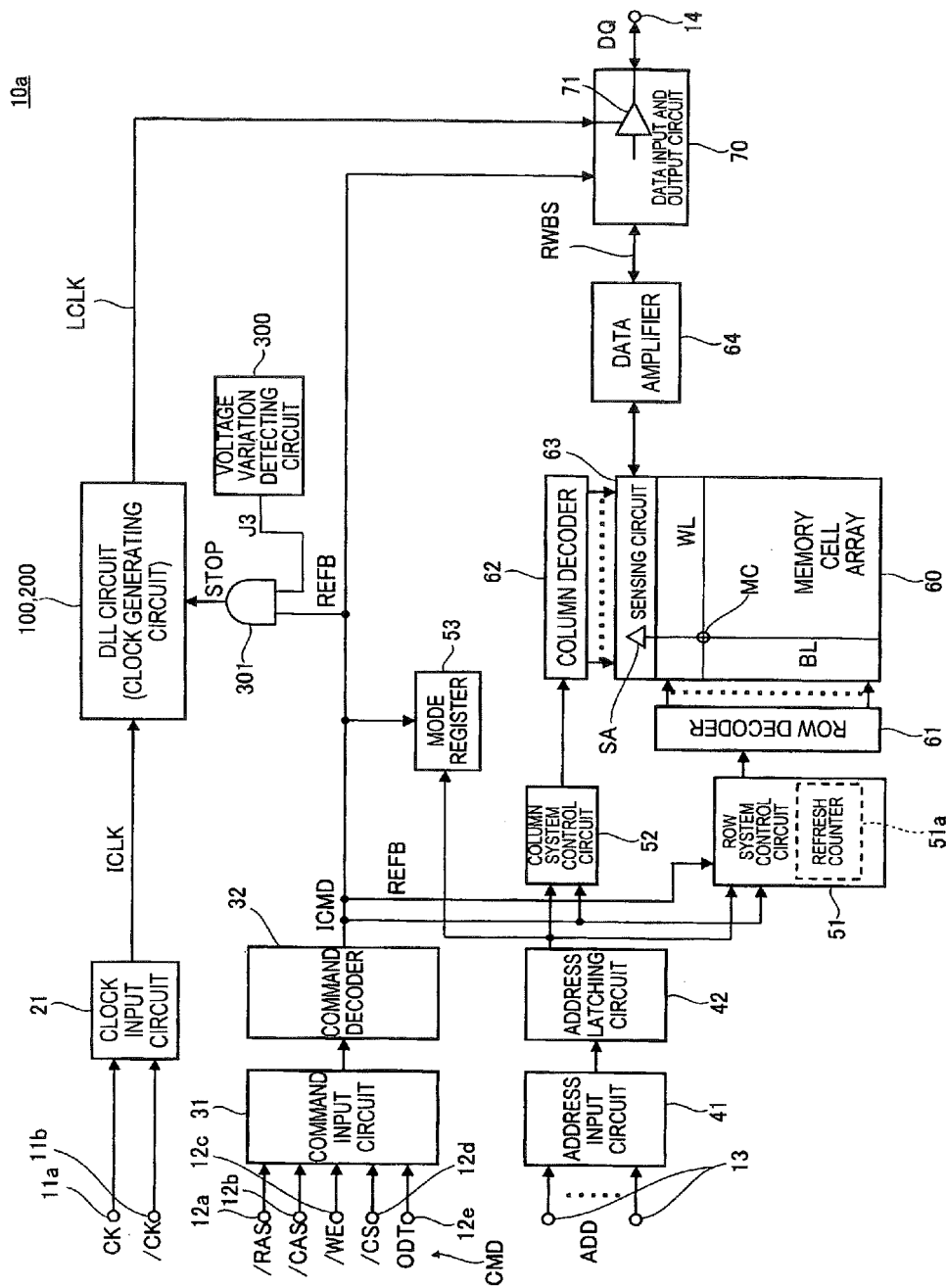
FIG. 8 is a block diagram of a configuration of a semiconductor device 10a according to the third embodiment.

FIG. 8 is a block diagram of a configuration of a semiconductor device 10a according to the third embodiment.

The semiconductor device 10a according to the third embodiment differs from the semiconductor device 10 shown in FIG. 1, in that it includes a voltage variation detecting circuit 300 and an AND gate 301. The semiconductor device 10a is identical to the semiconductor device 10 shown in FIG. 1 in all other aspects. Therefore, like reference numerals are denoted to like elements and redundant explanations thereof will be omitted.

The voltage variation detecting circuit 300 is a circuit that causes a detection signal J3 to activate when it detects variation in power supply voltage. The generated detection signal J3 and the refresh signal REFS are input into the AND gate 301. In the third embodiment, an output of the AND gate 301 is used as the stop signal STOP, and it is supplied to the DLL circuit 100 or 200.

Figure 9:
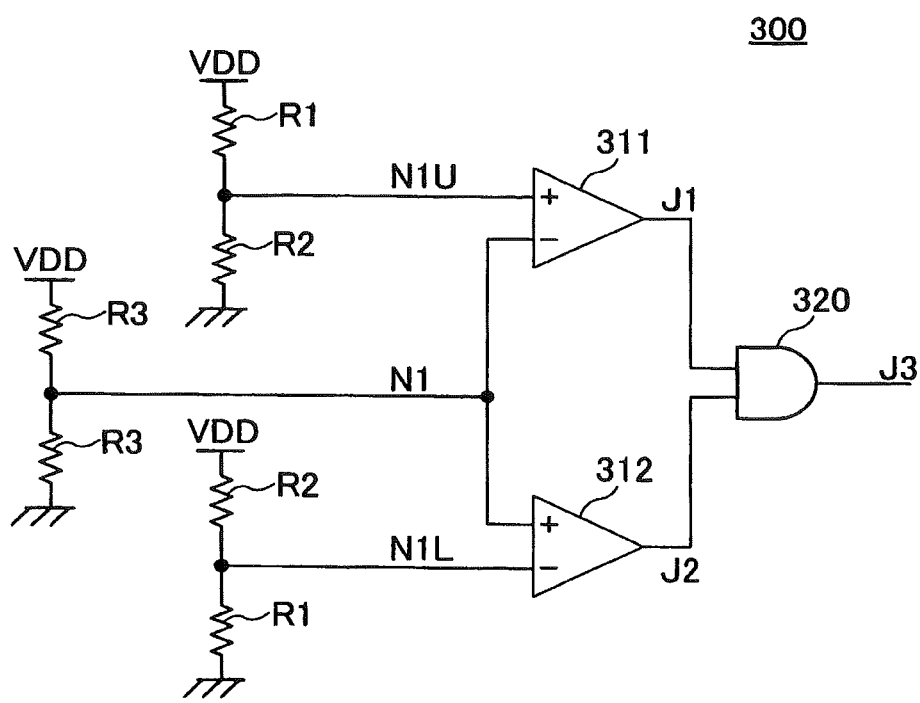
FIG. 9 is a circuit diagram of the voltage variation detecting circuit 300.

FIG. 9 is a circuit diagram of the voltage variation detecting circuit 300.

As shown in FIG. 9, the voltage variation detecting circuit 300 includes a plurality of resistors R1 to R3, comparators 311 and 312, and an AND gate 320. An inverting input node (+) of the comparator 311 is connected to a node N1U of the resistors R1 and R2 connected in series between the terminals of the power source. Furthermore, a non-inverting input node (−) of the comparator 312 is connected to a node N1L of the resistors R2 and R1 connected in series between the terminals of the power source. The non-inverting input node (−) of the comparator 311 and the inverting input node (+) of the comparator 312 are connected to a node N1 of the two resistors R3 connected in series between the terminals of the power source.

Resistance values of the resistors R1 to R3 are set such that R2>R1>>R3. Due to this, the voltage of the node N1 becomes half of power supply voltage VDD (=VDD/2), the voltage of the node N1U becomes greater than half of the power supply voltage VDD (>VDD/2), and the voltage of the node N1L becomes less than half of the power supply voltage VDD (<VDD/2). For example, when the power supply voltage VDD is 1.2 V, N1, N1U, and N1L, respectively, are set to 0.6 V, 0.7 V, and 0.5 V. As a result, detection signals J1 and J2 that are outputs of the comparators 311 and 312 change to a high level, and the detection signal J3 also changes to a high level (an non-active level).

When the power supply voltage VDD varies rapidly, the voltages of the nodes N1, N1U, and N1L also vary. However, as described above, because the resistance values of the resistors R1 and R2 are substantially greater than the resistance values of the resistors R3, voltages vary slowly at the nodes N1U and N1L as compared to that at the node N1. Thus, when the power supply voltage VDD varies at an acceleration equal to or higher than a predetermined acceleration, one of the detection signals J1 and J2 is inverted to a low level and the detection signal J3 is activated to a low level. Based on this principle, the voltage variation detecting circuit 300 can detect rapid variations in the power supply voltage VDD.

As shown in FIG. 8, the detection signal J3 that is an output of the voltage variation detecting circuit 300 is input into the AND gate 301. Thus, in the third embodiment, the operation mode of the DLL circuit 100 or 200 is set to the first operation mode and the phase control operation is restarted not only when the refresh signal REFB is activated but also when the detection signal J3 is activated.

In the third embodiment, the phase control unit 120 is caused to shift from the second operation mode to the first operation mode in response to the detected variation in the power supply voltage VDD. Thus, phase shifting of the internal clock signal LCLK that occurs due to variations in the power supply voltage VDD can be prevented.

A fourth embodiment of the present invention is explained next.

Figure 10:
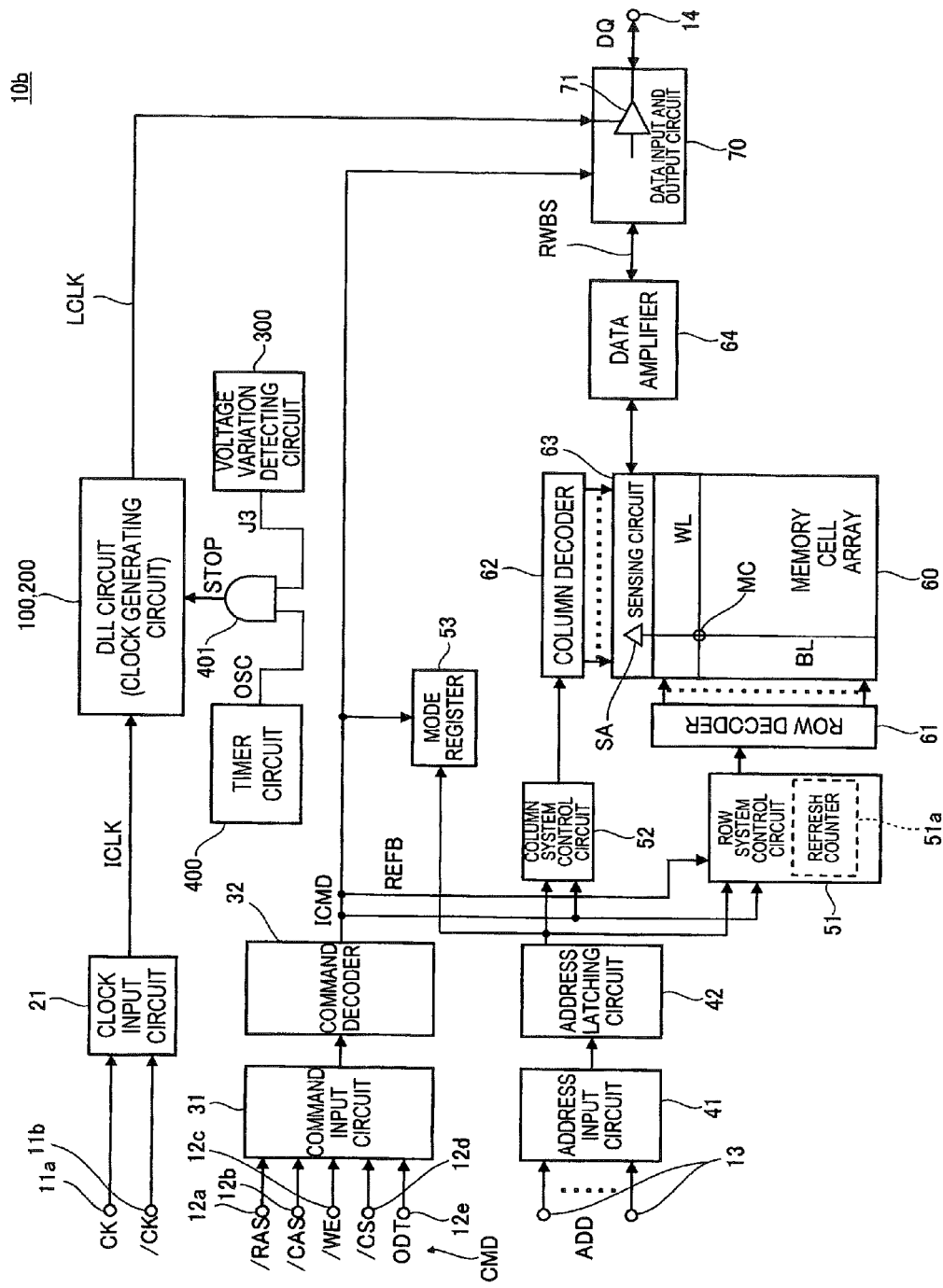
FIG. 10 is a block diagram of a semiconductor device 10b according to the fourth embodiment.

FIG. 10 is a block diagram of a semiconductor device 10b according to the fourth embodiment.

The semiconductor device 10b according to the fourth embodiment differs from the semiconductor device 10a shown in FIG. 8, in that it includes a timer circuit 400 and an AND gate 401. The semiconductor device 10b is identical to the semiconductor device 10a shown in FIG. 8 in all other aspects. Therefore, like reference numerals are denoted to like elements and redundant explanations thereof will be omitted.

The timer circuit 400 is a circuit that activates a timer signal OSC at a predetermined cycle. The timer circuit 400 operates asynchronously with respect to outside of the semiconductor device 10b. The timer signal OSC is a signal that is used instead of the refresh signal REFB, and it is input into the AND gate 401 along with the detection signal J3. In the fourth embodiment, an output of the AND gate 401 is used as the stop signal STOP, and the STOP signal is supplied to the DLL circuit 100 or 200.

In the fourth embodiment, the timer signal OSC is used instead of the refresh signal REFB. Therefore, the phase control unit 120 can be shifted from the second operation mode to the first operation mode at a predetermined cycle. Due to this, a state that the phase control unit 120 does not shift to the second operation mode for a long time because the auto refresh command is continuously issued, or a state that the phase control unit 120 does not shift to the first operation mode for a long time because the auto refresh command is not issued for a long time will not occur:

A commonly known refresh timer, which is used during a self-refresh operation in which a current value is restrained, can be used as the timer circuit 400. Due to this, a separate timer circuit 400 is not required. Moreover, because the refresh timer requires very low operation power, power consumption can be significantly reduced. When such a refresh timer is used, the activation interval of the timer signal OSC matches with the activation interval of the refresh signal REFB. Thus, the interval of shifting to the first operation mode is the same as that in the first and second embodiments.

Figure 11:
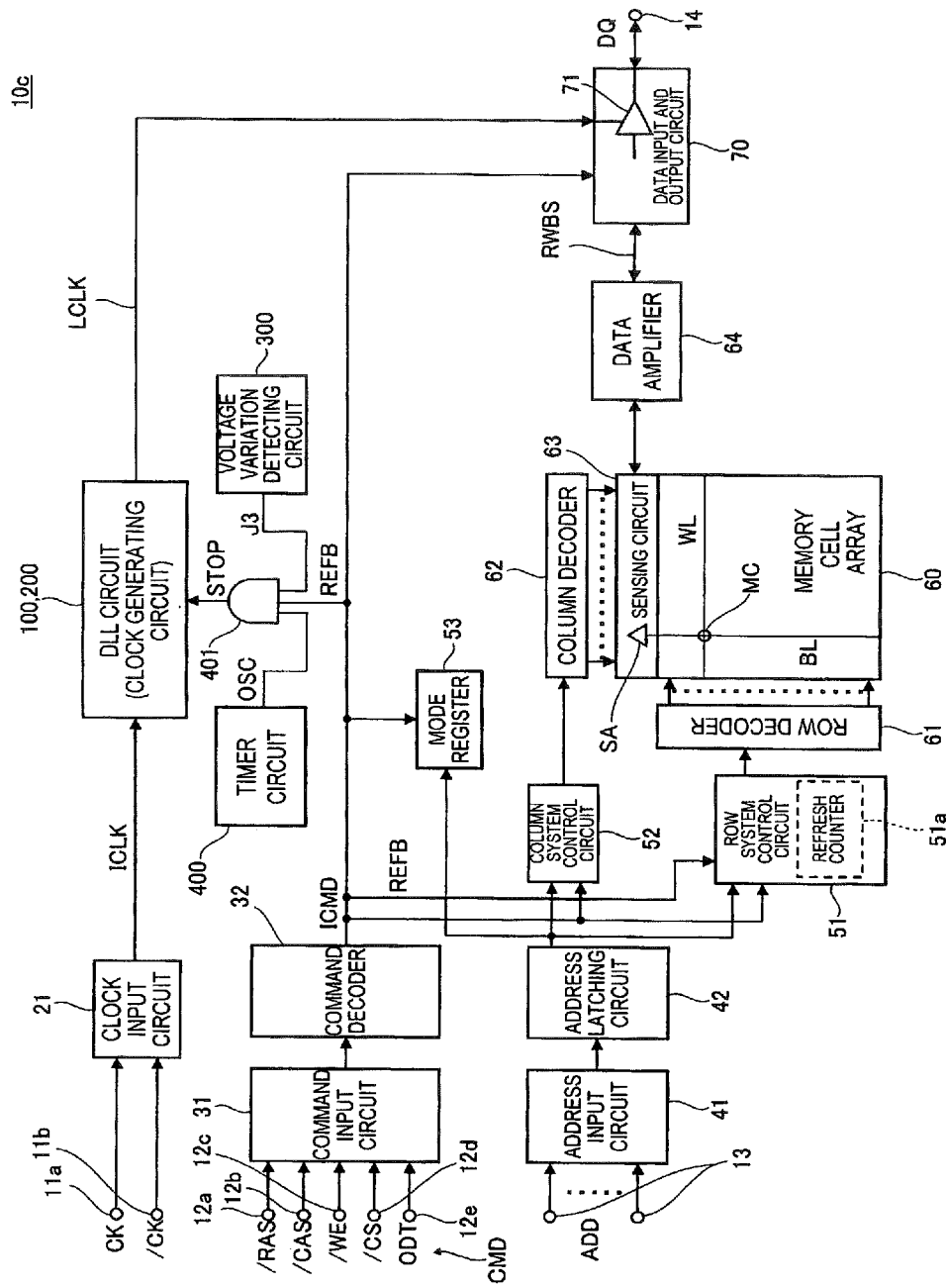
FIG. 11 is a block diagram of a semiconductor device 10b according to a modification.

As in a semiconductor device 10c shown in FIG. 11, the timer signal OSC and the refresh signal REFB can be combined.

Figure 12:
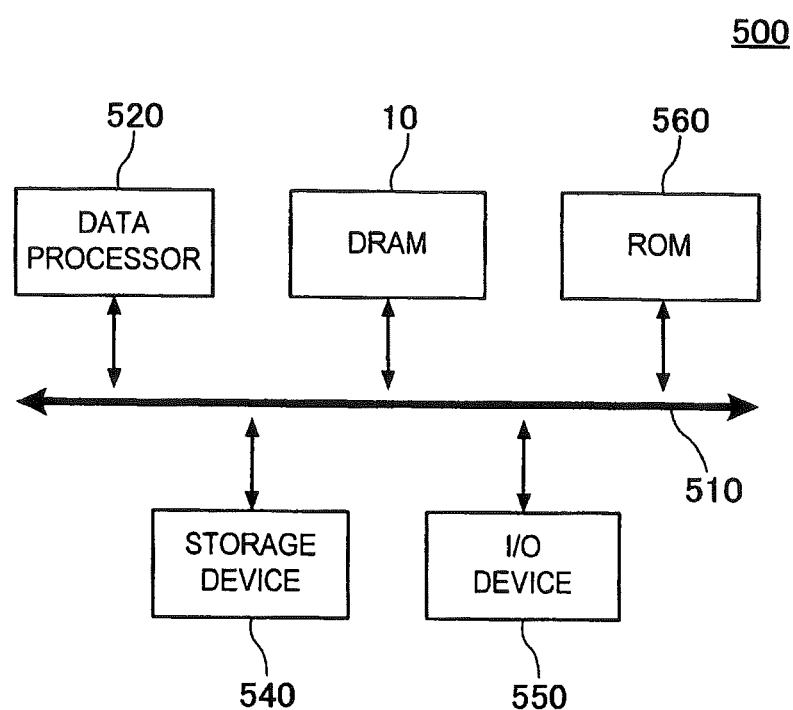
FIG. 12 is a block diagram of a data processing system 500 that includes the semiconductor device 10.

FIG. 12 is a block diagram of a data processing system 500 that includes the semiconductor device 10 according to an embodiment of the present invention.

The data processing system 500 shown in FIG. 12 has a configuration in which a data processor 520 as a controller and the semiconductor device (DRAM) 10 according to the present embodiment are mutually connected via a system bus 510. For example, the data processor 520 can be a microprocessor (MPU) or a digital signal processor (DSP), but is not limited thereto. For the sake of simplification, the data processor 520 and the DRAM 10 are shown to be connected via the system bus 510 in FIG. 12. Alternatively, the data processor 520 and the DRAM 10 can be connected by a local bus.

In the data processing system 500 shown in FIG. 12, at least the clock terminals 11a and 11b (first external terminals) and the data input and output terminal 14 (a second external terminal) of the semiconductor device 10 shown in FIG. 1 are connected to the data processor 520 via the system bus 510.

Furthermore, for the sake of simplification, only one set of the system bus 510 is shown in FIG. 12. Plural sets of system buses can be provided in series or parallel, as required, by connecting through one or more connectors. In the data processing system 500 shown in FIG. 12, a storage device 540, an I/O device 550, and a ROM 560 are connected to the system bus 510; however, these constituent elements are not essential.

The storage device 540 can be a hard disk drive, an optical disk drive, a flash memory and the like. The I/O device 550 can be a display device such as a liquid crystal display, and an input device such as a keyboard and a mouse. Furthermore, the I/O device 550 can be either the input device or the output device. For the sake of simplification, only one each of the constituent elements of the data processing system 500 is shown in FIG. 12. Two or more of all the constituent elements or a part thereof can be provided.

It is apparent that the present invention is not limited to the above embodiments, but may be modified and changed without departing from the scope and spirit of the invention.

For example, while an SDRAM having a DLL circuit incorporated therein has been explained in the above embodiments, the application range of the present invention is not limited thereto, and the invention is also applicable to semiconductor devices other than memories. Specifically, the present invention can be applied to semiconductor products in general, such as a CPU (Central Processing Unit), MCU (Micro Control Unit), DSP (Digital Signal Processor), ASIC (Application Specific Integrated Circuit), or ASSP (Application Specific Standard Circuit), having an DLL circuit incorporated therein.

The clock generating circuit according to the present invention is not limited to a DLL circuit, and the present invention is applicable to any other type of a clock generating circuit as far as it can generate a phase-adjusted internal clock signal.

In the above embodiments, the phase control unit 120 is shifted between the first operation mode and the second operation mode. However, the phase control unit 120 can include a third operation mode. That is, shifting directly from the first operation mode to the second operation mode (or vice versa) is not essential, and such shifting can be performed via the third operation mode.

In the above embodiments, the refresh signal REFB, the detection signal J3 that indicates variations in the power supply voltage VDD, and the timer signal OSC are used as the trigger signal for shifting to the first operation mode. However, in the present invention, the trigger signal is not limited to these signals. For example, an external command that causes the DLL circuit to exit the self-refresh operation (generally, regulated by shifting from a low level to a high level of an external terminal CKE) can be used as the trigger signal. When two or more trigger signals are used, they can be combined as desired. The trigger signal can be either generated inside the semiconductor device or supplied from outside.

Similarly, in the above embodiments, the dither determination or the non-continuity determination is used for detecting the DLL lock for shifting the phase control unit 120 to the second operation mode. However, other methods can also be used for detecting the DLL lock. When two or more detection methods are used, they can be combined as desired. In the above embodiments, the DLL lock is determined in the dither determination when the up/down signal U/D changes two times. However, some other rule can be used for the dither determination. Similarly, some other rule can be used for the non-continuity determination.

When the present invention is applied to a DLL circuit that includes two phase control units 120 where one of the phase control units 120 controls a position of a rising edge of the internal clock signal LCLK and the other phase control unit 120 controls a position of a falling edge of the internal clock signal LCLK, detection of the DLL lock is performed for both of the rising edge and the falling edge of the internal clock signal LCLK. When the DLL lock is detected, respectively, for both the edges, the phase control units 120 can be shifted to the second operation mode.

In the above embodiments, the operations of all the circuit blocks that constitute the phase control units 120 and 220 to be shifted to the second operation mode are stopped. However, stopping the operations of all the circuit blocks that constitute a phase control unit is not essential, and the operations of some of the circuit blocks can be continued.

A device to which the present invention is applied can be also applied to a semiconductor device such as an SOC (System on Chip), MCP (Multi Chip Package), and POP (Package on Package). Furthermore, the transistor of the present invention can be an FET (Field Effect Transistor) or a bipolar transistor. The transistor can be applied to various types of FETs such as a MIS (Metal-Insulator Semiconductor) and TFT (Thin Film Transistor) as well as MOS (Metal Oxide Semiconductor). The type of the transistor can be other than FETs, and a bipolar transistor can be partially included.

Furthermore, a P-channel transistor or a PMOS transistor is a representative example of a first conductive transistor, and an N-channel transistor and an NMOS transistor is a representative example of a second conductive transistor. Further, a semiconductor substrate used in the present invention is not limited to a P-type semiconductor substrate, and it can be an N-type semiconductor substrate, a semiconductor substrate with an SOI (Silicon on Insulator) structure, or other types of semiconductor substrates.

Furthermore, a circuit configuration of a dither determining circuit and a continuity determining circuit is not limited to the circuit configuration disclosed in the above embodiments.

Different combinations and selections of various disclosed elements can be made within the scope of the claims of the present invention. That is, it should be readily understood that the present invention embraces the entire disclosure of this specification including the claims, as well as various changes and modifications that can be achieved by those skilled in the art based on the technical concept of the invention.

What is claimed is:

1. A method for generating an internal clock signal by a clock generating circuit, comprising:
   generating the internal clock signal based on an external clock signal;
   adjusting a phase of the internal clock signal by using a phase control value to synchronize with a phase of the external clock signal based on a phase difference between the external clock signal and the internal clock signal; and
   switching operation modes including a first operation mode in which a phase of the internal clock signal is controlled at a predetermined cycle by updating the phase control value and a second operation mode in which a phase of the internal clock signal is fixed by fixing the phase control value,
   wherein the switching includes switching from the second operation mode to the first operation mode in response to a trigger signal, and
   the switching includes switching from the first operation mode to the second operation mode in response to a state where the internal clock signal attains a predetermined phase;
   wherein the trigger signal is generated in response to an output signal of a power detecting circuit, and wherein the power detecting circuit outputs a first level of the output signal when a power supply voltage varies equal to or higher than a reference acceleration and outputs a second level of the output signal when the power supply voltage varies smaller than the reference acceleration, the first and second levels being different from each other.

2. The clock generating circuit as claimed in claim 1, wherein the trigger signal is activated at the time of a refresh operation that restores information in a memory cell is performed.

3. The clock generating circuit as claimed in claim 2, wherein the switching includes switching from the second operation mode to the first operation mode after the refresh operation is completed.

4. The method for generating an internal clock signal as claimed in claim 1, further comprising:
   outputting an output signal to outside in synchronization with the internal clock signal by an output buffer,
   wherein the clock generating circuit includes:
      a replica circuit that generates a feedback clock signal from the internal clock signal, the feedback clock signal being supplied to the phase-controlling unit; and
      the replica circuit has a substantially same circuit configuration as the output buffer.

5. The method for generating an internal clock signal as claimed in claim 1, wherein the trigger signal is output by a logic circuit which includes a first input node configured to receive the output signal of the power detecting circuit and a second input node configured to receive a refresh signal.

6. The method for generating an internal clock signal as claimed in claim 1, wherein the trigger signal is output by a logic circuit which includes a first input node configured to receive the output signal of the power detecting circuit and a second input node configured to receive an output of a timer circuit.

7. A method for generating a clock by a clock generating circuit comprising:
   receiving a first clock signal and a first control signal and outputting a second clock signal;
   comparing the second clock signal with the first clock signal and outputting a comparison signal; and
   receiving the comparison signal and sending the first control signal to control the outputting the second clock signal,
   wherein the clock generating circuit is controlled by a control circuit outputting a second control signal, the second control signal being output in response to at least a first detection signal that is generated when a first variation of a power supply voltage has been detected; and
   the detection signal is generated by a detecting circuit, the detecting circuit including:
      first, second and third resistor circuits each coupled between a power supply and a ground;
      a first comparator including a first input node coupled to the first resistor circuit and a second input node coupled to the third resistor circuit, and including an output node;
      a second comparator including a first input node coupled to the third resistor circuit and the second resistor circuit, and including an output node; and
      an AND gate including a first input node coupled to the output node of the first comparator and the second input node coupled to the output node of the second comparator, and the AND gate outputting an output signal of the detecting circuit.

8. The method for generating a clock as claimed in claim 7, wherein the second control signal is further output in response to a second detection signal that is generated when a first time period elapse of deactivation of the clock generating circuit has been detected.

9. The method for generating a clock as claimed in claim 7, wherein the control circuit further includes:
   a logic circuit receiving the first detection signal output from the detecting circuit that detects the first variation of the power supply voltage of the device and an additional signal, and the logic circuit outputting the second control signal,
   wherein the additional signal is one of a refresh signal that is generated in a refresh operation and a timer signal that is generated when a first time period elapse of deactivation of the clock generating circuit has been detected.

10. The method for generating a clock as claimed in claim 7, wherein the detecting circuit detects a variation of the power supply voltage of the device,
   wherein the detecting circuit generating a first level of the first detection signal when it is detected that a variation of the power supply voltage of the device is equal to or higher than the first variation, and the detecting circuit further generating a second level of the first detection signal when it is detected that a variation of the power supply voltage of the device is smaller than the first variation, the first and second level being different from each other.

11. The method for generating a clock as claimed in claim 7, wherein the first resistor circuit of the detecting circuit comprises:
   a first resistor coupled between the power supply and a first intermediate node; and
   a second resistor coupled between the first intermediate node and the ground, wherein the first intermediate node being coupled to the first input node of the first comparator,
   wherein the second resistor circuit of the detecting circuit comprises:
      a third resistor coupled between the power supply and a second intermediate node;
      a fourth resistor coupled between the second intermediate node and the ground,
      the second intermediate node being coupled to the second input node of the second comparator;
   wherein the third resistor circuit of the detecting circuit comprises:
      a fifth resistor coupled between the power supply and a third intermediate node;
      a sixth resistor coupled between the third intermediate node and the ground, the third intermediate being coupled to the second input node of the first comparator and the first input node of the second comparator; and
   wherein the first and fourth resistors are the substantially same in a resistance value as each other,
   wherein the second and third resistors are the substantially same in a resistance value as each other, and
   wherein each of the fifth and sixth resistors is smaller in a resistance value than each of the first, second, third, and fourth resistors.

12. The method for generating a clock as claimed in claim 7, wherein the clock generating circuit is controlled so as to change from deactivation to activation in response to the first detection signal.

13. A method for generating a clock comprising:
   receiving a first clock signal and outputting a second clock signal;
   comparing the second clock signal with the first clock signal to change, when activated, a delay of the second clock signal;
   supplying a first voltage to a first voltage line;
   supplying a second voltage to a second voltage line; and
   detecting a variation in voltage according to an acceleration of a variation of a power supply voltage by a voltage detecting circuit; and
   the voltage detecting circuit activating the phase control circuit in response to the detecting thereof.

14. The method for generating a clock according to claim 13, further comprising:
   counting a first cycle by a timer circuit, wherein the timer circuit activating the phase control circuit in response to the counting of the first cycle.

15. The method for generating a clock according to claim 13, wherein when the power supply voltage varies at an acceleration equal to or greater than a predetermined acceleration, a detection signal outputted by the voltage detecting circuit is activated to a low level.

16. The method for generating a clock according to claim 13, wherein the voltage detecting circuit includes a plurality of resistors including a first and a second resistor substantially greater than the resistance values of a third resistor.

* * * * *